US009484553B2

(12) United States Patent
Dai et al.

(10) Patent No.: US 9,484,553 B2
(45) Date of Patent: Nov. 1, 2016

(54) ORGANIC LIGHT-EMITTING DIODE DEVICE AND MANUFACTURING METHOD THEREOF

(71) Applicant: BOE TECHNOLOGY GROUP CO., LTD., Beijing (CN)

(72) Inventors: Qing Dai, Beijing (CN); Ze Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/360,366

(22) PCT Filed: Nov. 30, 2013

(86) PCT No.: PCT/CN2013/088247
§ 371 (c)(1),
(2) Date: May 23, 2014

(87) PCT Pub. No.: WO2015/043054
PCT Pub. Date: Apr. 2, 2015

(65) Prior Publication Data
US 2015/0084017 A1   Mar. 26, 2015

(30) Foreign Application Priority Data

Sep. 25, 2013   (CN) .......................... 2013 1 0450562

(51) Int. Cl.
*H01L 51/52* (2006.01)
*H01L 27/32* (2006.01)

(52) U.S. Cl.
CPC ....... *H01L 51/5268* (2013.01); *H01L 51/5262* (2013.01); *H01L 27/3246* (2013.01); *H01L 2251/5369* (2013.01)

(58) Field of Classification Search
CPC ................. H01L 51/5268; H01L 2251/5369; H01L 51/5262; H01L 27/3211; H01L 27/3244; H01L 27/3246; H01L 27/3283; H01L 51/5036; H01L 51/5265; H01L 51/5275; H01L 51/5284; H01L 51/56
USPC .............................................. 257/40; 438/23
See application file for complete search history.

(56) References Cited

U.S. PATENT DOCUMENTS 8,754,434 B1 *   6/2014  Gollier ................ H01L 51/5268
                                                        257/434
9,054,057 B2 *   6/2015  Lee .................... H01L 51/5253
(Continued)

FOREIGN PATENT DOCUMENTS

CN        1971933 A      5/2007
WO     2010/030591 A     3/2010
(Continued)

OTHER PUBLICATIONS

International Search Report for International Application No. PCT/CN2013/088247, 14pgs.
(Continued)

*Primary Examiner* — William F Kraig
*Assistant Examiner* — Edward Chin
(74) *Attorney, Agent, or Firm* — Ladas & Parry LLP

(57) ABSTRACT

The embodiment of the present invention relates to an organic light-emitting diode (OLED) device, which comprises a pixel define layer (PDL) and a light-emitting structure. Metal nanoparticles are doped in the PDL. The OLED device improves the luminous efficiency. The embodiment of the present invention further provides a method for manufacturing the OLED device.

6 Claims, 3 Drawing Sheets

(56) References Cited

U.S. PATENT DOCUMENTS

| | | | |
|---|---|---|---|
| 2008/0093978 A1* | 4/2008 | Mori | B82Y 20/00 313/498 |
| 2008/0297029 A1* | 12/2008 | Cok | B82Y 20/00 313/498 |
| 2008/0297045 A1* | 12/2008 | Cok | B82Y 20/00 313/506 |
| 2009/0058268 A1* | 3/2009 | Yoshida | B82Y 20/00 313/504 |
| 2012/0112165 A1* | 5/2012 | Charlton | H01L 27/14603 257/21 |
| 2013/0105770 A1* | 5/2013 | Pschenitzka | H01L 31/0232 257/40 |
| 2013/0200780 A1* | 8/2013 | Lee | H01L 51/5262 313/504 |
| 2014/0008618 A1* | 1/2014 | Lim | H01L 51/5268 257/40 |
| 2014/0008636 A1* | 1/2014 | Fukuura | B82Y 20/00 257/40 |
| 2014/0168572 A1* | 6/2014 | Iwata | H01L 51/5268 349/61 |
| 2015/0084005 A1* | 3/2015 | Sista | H01L 51/5268 257/40 |

FOREIGN PATENT DOCUMENTS

| | | | | |
|---|---|---|---|---|
| WO | WO 2010030591 A2 * | 3/2010 | | H01L 27/3246 |
| WO | 2012133779 A1 | 10/2012 | | |
| WO | 2013021941 A1 | 2/2013 | | |

OTHER PUBLICATIONS

First Office Action issued by the Chinese Patent Office for Chinese Patent Application No. 201310450562.1, 6pgs.

The State Intellectual Property Office of the People's Republic of China ("SIPO") (Chinese language) second office action issued on Jan. 6, 2015 by SIPO in Chinese Patent Application 2013104505621. Four (4) pages.

English Translation of The State Intellectual Property Office of the People's Republic of China ("SIPO") (Chinese language) second office action issued on Jan. 6, 2015 by SIPO in Chinese Patent Application 2013104505621. Four (4) pages.

Third Chinese Action dated Apr. 21, 2015; Appln. No. 201310450562.1.

International Preliminary Report on Patentability issued Mar. 29, 2016; PCT/CN2013/088247.

* cited by examiner

ORGANIC LIGHT-EMITTING DIODE DEVICE AND MANUFACTURING METHOD THEREOF

CROSS REFERENCE TO RELATED APPLICATIONS

This application is based on International Application No. PCT/CN2013/088247 filed on Nov. 30, 2013, which claims priority to Chinese National Application No. 201310450562.1 filed on Sep. 25, 2013. The entire contents of each and every foregoing application are incorporated herein by reference.

TECHNICAL FIELD

Embodiments of the present invention relate to an organic light-emitting diode (OLED) device and a manufacturing method thereof.

BACKGROUND

The basic structure of an OLED device is as follows: one or more organic emission layers are interposed between two electrode layers. The two electrode layers respectively work as an anode and a cathode of the OLED device. The electrodes may be made of a metallic material or a metal oxide material as required. Under the action of an external voltage, electron and hole carriers are respectively injected into the organic emission layer from the directions of the cathode and the anode, and meet each other and are recombined to generate excitons. The energy of the excitons is degraded in the form of light, so that light is radiated, and therefore the electroluminescent effect can be achieved.

In the OLED device, the energy loss mainly exists in two aspects. Firstly, when the carriers are injected into the emission layer for luminescence through recombination, not all the energy can be converted into photons; and one part of energy will loss in the process of radiative transition such as lattice vibration and deep-level impurity transition. This process may be described by the internal quantum efficiency. Secondly, radiated light will be fully reflected at interfaces of anode/substrate, substrate/air and the like and cannot be refracted. Moreover, due to the waveguide mode loss at an anode/organic emission layer interface and the surface plasmon loss and the like near metal electrodes, only about 20 percent of light can transmit through the device and be used for display. This process may be described by the external quantum efficiency.

At present, various methods have been tried to improve the external quantum efficiency, namely improve the light extraction efficiency or the luminous efficiency. For instance, the waveguide mode loss can be reduced by manufacturing a surface microstructure on a metal oxide electrode (e.g., indium tin oxide (ITO)); the total reflection can be reduced by adhering photonic crystals or micro-lens arrays onto a glass substrate; the surface plasmon loss can be reduced by manufacturing a cathode with folds; and an optical micro-cavity structure is utilized.

Although these technologies can greatly improve the luminous efficiency of the device, there are also defects. For instance, as for the methods of forming a periodic or quasi-periodic microstructure pattern on a cathode and adhering the photonic crystals or the micro-lens arrays onto the glass substrate, a nano photo printing technology is always used, and hence the manufacturing process is complex and the difficulty is large. The optical micro-cavity effect is likely to cause the problems such as color-shift of light and narrower viewing angle.

SUMMARY

The embodiments of the present invention provide an OLED device capable of improving the external quantum efficiency.

In one aspect, the present invention provides an OLED device, which comprises a PDL (pixel defining layer) and a light-emitting structure. Metal nanoparticles are disposed in the PDL.

For instance, an isolation layer is disposed between the metal nanoparticles and light-emitting molecules in the light-emitting structure. For instance, the isolation layer may be part of the PDL or the isolation layer and the metal nanoparticles form an independent core-shell structure.

For instance, the isolation layer may be made of an insulating media.

For instance, a metallic material in the metal nanoparticles may be one selected from gold, silver and aluminum, or one selected from alloy of gold, alloy of silver, and alloy of aluminum, or an alloy formed of any two or three of gold, silver and aluminum.

For instance, the shape of the metal nanoparticles is one or more selected from sphere, prism, cube and cage.

For instance, the particle diameter of the metal nanoparticles may be from 1 to 100 nm.

In another aspect, the present invention provides a method for manufacturing an OLED device, which comprises: forming a matrix material layer doped with metal nanoparticles on a substrate provided with an electrode; and processing the matrix material layer by a patterning process and obtaining a PDL in a required shape.

For instance, one example of forming the matrix material layer comprises: forming a first matrix material layer on the substrate provided with the electrode; forming metal nanoparticles, which are dispersedly provided, by sputtering metallic materials on the first matrix material layer; and forming a second matrix material layer on the first matrix material layer on which the dispersedly provided metal nanoparticles are formed.

For instance, another example of forming the matrix material layer comprises: forming the matrix material layer doped with the metal nanoparticles by simultaneously sputtering a matrix material and metal nanoparticles on the substrate provided with the electrode.

For instance, after the step of obtaining the PDL in a required shape, the method further comprises: immersing the PDL in a required shape into an etching solution and removing exposed metal nanoparticles.

For instance, the matrix material may be made of silicon dioxide, silicon nitride oxide, aluminum oxide or the like.

For instance, still another example of forming the matrix material layer comprises: providing the metal nanoparticles; forming a mixture solution of the metal nanoparticles by mixing the metal nanoparticles and the matrix materials; and forming the matrix material layer doped with the metal nanoparticles by coating the mixture solution on the substrate provided with the electrode.

For instance, the matrix material may be polyimide.

For instance, the matrix material may be SiO2 gel.

For instance, after the step of providing the metal nanoparticles, the method may further comprise: forming an isolation layer in the periphery of the metal nanoparticles, and combining the isolation layer and the metal nanoparticles into an independent core-shell structure; and forming a mixture of the metal nanoparticles by mixing the matrix material and the metal nanoparticles provided with the isolation layer in the periphery.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Detailed description will be given below to the OLED device and the manufacturing method thereof provided by the embodiments of the present invention with reference to the accompanying drawings.

Figure 1:
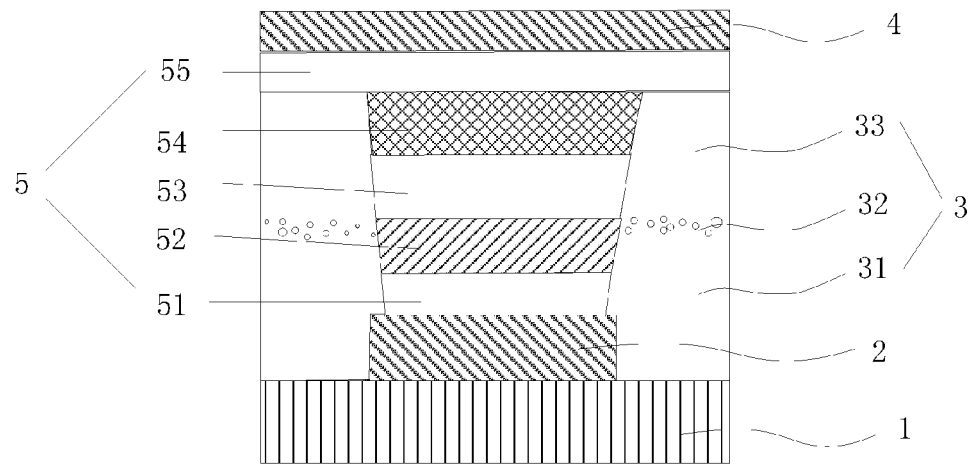
FIG. 1 is a schematic structural view of an OLED device provided by an embodiment of the present invention.
Figure 2:
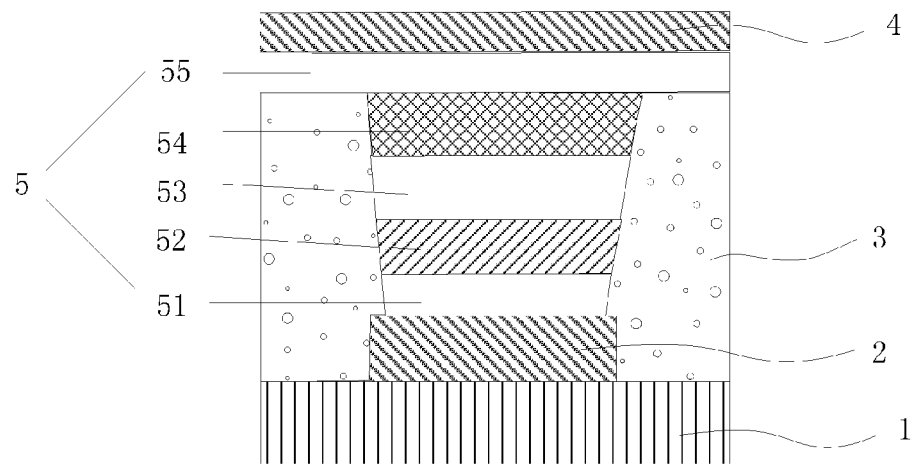
FIG. 2 is a schematic structural view of an OLED device provided by another embodiment of the present invention.

One embodiment of the present invention provides an OLED device. As illustrated in FIGS. 1 and 2, the OLED device comprises a substrate 1, an anode 2 disposed on the substrate 1, a pixel defining layer (PDL) 3 disposed on the substrate 1 and the anode 2, and a cathode 4 disposed on the PDL. A light-emitting structure 5 is disposed within a space defined by the PDL 3. For instance, the light-emitting structure 5 may have a single layer structure, e.g., only comprising one layer of organic light-emitting material. The light-emitting structure 5 may also have a three-layer device structure, e.g., comprising a hole transport layer (HTL), an emission layer (EML) and an electron transport layer (ETL) in sequence from the bottom up. In addition, the light-emitting structure 5 may also have a five-layer device structure, as illustrated in FIGS. 1 and 2, comprising a hole injection layer (HIL) 51, an HTL 52, an EML 53, an ETL 54 and an electron injection layer (EIL) 55 in sequence from the bottom up. Of course, the light-emitting structure 5 may also include a plurality of EMLs or include other film layer structure such as a hole barrier layer (HBL). No limitation will be given here in the embodiment.

It should be understood that FIGS. 1 and 2 in the embodiments are used for better description of the PDL in the OLED device provided by the embodiments. The embodiments are not limited to the specific selection of the substrate, the anode, the cathode and the light-emitting materials as shown in the figure and the position relationships and dimension relationships with the PDL.

Metal nanoparticles are doped in the PDL 3. The metal nanoparticles are metallic particles of which the particle diameter is in the nano level. For instance, the particle diameter may be 1 to 100 nm. The metal nanoparticles are dispersedly provided in the PDL.

It should be noted that the content of the metal nanoparticles in the PDL is not specifically limited in the embodiments of the present invention. But it should be understood that the content of the metal nanoparticles preferably should not result in the electricity creepage or short circuit between pixels.

The doping of the metal nanoparticles in the PDL may be uniform doping, as illustrated in FIG. 2, or may be non-uniform doping, for instance, the metal nanoparticles are embedded into the PDL according to certain regular pattern. As illustrated in FIG. 1, the metal nanoparticles are only distributed in a plane around the middle of the PDL.

An organic emission layer of the light-emitting structure 5 includes light-emitting molecules which may be fluorescent molecules or phosphorescent molecules. Description will be given below by taking the case that the light-emitting molecules are fluorescent molecules as an example. When the anode 2 and the cathode 4 of the OLED device are energized, the light-emitting materials in the light-emitting structure 5 emit light due to the recombination of electrons and holes; and the light emitted by the light-emitting materials is incident into the PDL 3 and interacts with the metal nanoparticles therein to form surface plasmon (SP). SP refers to an electronic longitudinal wave propagating along a metal surface generated by the interaction of electrons and photons subjected to free vibration on the metal surface. If the metal surface is very rough or near a metal curved surface structure (e.g., a sphere and a cylinder), at this point, SP cannot propagate along the interface in the form of wave but is localized to the vicinity of the structure. In this case, SP is also referred to as localized surface plasmon (LSP). When metallic particles, the size of which is close to or less than the wavelength, are illuminated, the oscillating electric field of the metallic particles drives the displacement of an electron cloud of the metallic particles relative to the core. A restoring force is generated under the action of the Coulomb attractive force between the electron cloud and the core, and hence the oscillation of the electron cloud in the periphery of the core can be caused. When the collective oscillation frequency of the electron cloud is close to or equal to the wavelength of exciting light, the LSP resonance can be invoked.

The oscillation frequency of the resonance is mainly determined by the factors such as electron density (determined by metal variety) of metal, effective electron mass, particle diameter, shape and ambient medium. In the case of LSP resonance, the electromagnetic field in the periphery of the metal nanoparticles is greatly enhanced. The LSP resonance has the following effects.

Firstly, in the case of appropriate surface distance between the fluorescent molecules in the light-emitting structure 5 and the metal nanoparticles, light radiated by excitons interacts with the metal nanoparticles to generate LSP resonance via induction, and hence the local electric field in the vicinity of the fluorescent molecules can be enhanced. Therefore, the rate of exciton transition radiation can be improved and the internal quantum efficiency can be enhanced.

Secondly, the scattering effect of the metal nanoparticles can change the direction of light irradiated on the nanoparticles, and light which cannot be emitted to the outside originally is scattered to the outside of the device, and hence the luminous efficiency of the device can be improved. Especially in the case of appropriate diameter of nanoparticles and phase, due to LSP action, the scattering cross-section of the nanoparticles to external light can be greatly enhanced.

In the OLED device provided by the embodiment of the present invention, the metal nanoparticles are doped in the PDL. When the OLED device is applied with a voltage, light incident into the PDL interacts with the metal nanoparticles in the PDL to generate LSP resonance. The resonance effect not only can improve the excitation intensity and efficiency of the fluorescent molecules, the fluorescence quantum yield and the internal quantum efficiency but also, more importantly, can greatly increase the light scattering and absorption cross-section of the metal nanoparticle so that light which cannot be emitted to the outside originally can be scattered, and hence the external quantum efficiency and the luminous efficiency of the OLED device can be improved. In addition, compared to optical microcavity effect, the resonance effect cannot change the luminescent spectrum of the OLED device and maximally maintains the original color of the device while improving the luminous efficiency simultaneously.

In another embodiment of the present invention, on the basis of the first embodiment, preferably, the particle diameter of the metal nanoparticles is from 1 to 100 nm. Moreover, preferably, metal nanoparticles with different particle diameters may be doped in the PDL so as to be applicable to the wavelength of light from the EML 53.

In still another embodiment of the present invention, on the basis of the first or second embodiment, preferably, the metal nanoparticles may be one selected from gold, silver and aluminum, may be one selected from alloy of gold, alloy of silver or alloy of aluminum, and may also be any alloy formed by two or three selected from gold, silver and aluminum.

In still another preferred embodiment, on the basis of any foregoing embodiment, the shape of the metal nanoparticles may be one or more selected from sphere, prism, cube and cage. Here, the shape of "cage" refers to a structure that the inside of a metal nanoparticle is hollow and holes and edge angles are uniformly distributed on the outside of the metal nanoparticle. The field intensity caused by LSP resonance is mainly enhanced at tip angles of the structures. As the enhancing factor for the field intensity at the positions is larger, the luminous efficiency can be improved.

In still another preferred embodiment, on the basis of any foregoing embodiment, an isolation layer may be disposed between the metal nanoparticles and the light-emitting molecules. In the process of the interaction between the metal nanoparticles and the light-emitting molecules from the light-emitting structure 5, there are two processes of opposite actions, namely fluorescent quenching and fluorescent enhancement. When the metal nanoparticles are too close to the light-emitting molecules, the fluorescent quenching effect can be easily invoked. Therefore, more preferably, the isolation layer is disposed between the metal nanoparticles and the light-emitting molecules. It should be understood that: because metal nanoparticles in the PDL 3 close to one side of the light-emitting structure 5 are close to the light-emitting structure, the isolation layer may be disposed between this part of metal nanoparticles and the light-emitting molecules. The isolation layer may be part of the PDL, namely the isolation layer is disposed in the PDL 3 and configured to separate the metal nanoparticles from the light-emitting structure 5. In addition, the isolation layer may also form a core-shell structure together with the metal nanoparticles. The metal nanoparticles are taken as the core and the isolation layer is taken as the shell. The core and the shell may be provided with a gap therebetween and may also make direct contact.

The isolation layer may be made of an insulating media selected from one or more from SiO2, Si3N4, SiOxNy, Al2O3, Y2O3, TiO2, Ta2O5 or HfO2. The isolation layer may also be made of an organic polymeric material selected from polymethyl methacrylate (PMMA), polypyrrole, polyaniline, polyethylene, polystyrene-acrylic acid (PST-AA) copolymer, polystyrene or the like.

Figure 3:
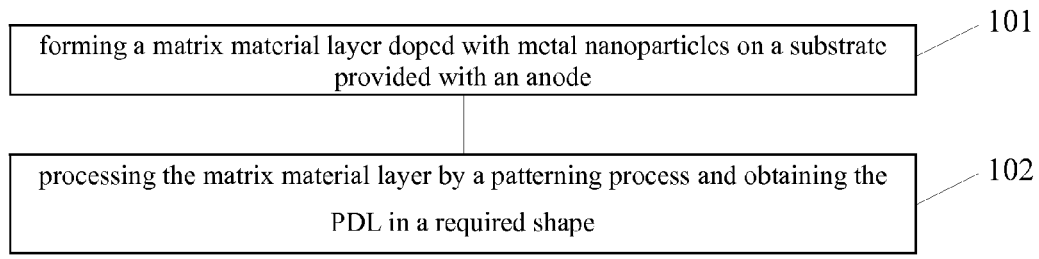
FIG. 3 is a flowchart of a method for manufacturing the OLED device, provided by an embodiment of the present invention.

Corresponding to the OLED device provided by the embodiments of the present invention, the embodiments of the present invention further provide a method for manufacturing the OLED device. The method comprises a method for preparing a PDL. As illustrated in FIG. 3, the method for preparing the PDL comprises the following processes.

101: forming a matrix material layer doped with metal nanoparticles on a substrate provided with, for instance, an anode.

The matrix material may be SiO2 particles, polyimide, SiO2 gel or the like. The description of the metal nanoparticles may refer to the foregoing embodiments. No further description will be given here. The anode is an example of an electrode of the OLED device. The present invention is not limited to the case of the anode being formed on the substrate. For instance, a cathode may also be formed on the substrate at first. As for the case of the cathode being formed on the substrate at first, the relevant manufacturing process may be basically the same as the case of the anode being formed on the substrate at first. Therefore, no further description will be given in the disclosure.

102: processing the matrix material layer by a patterning process and obtaining the PDL in a required shape.

In the step, the patterning process may be conducted as follows. The matrix materials may be processed via the steps of exposure, development and/or etching by coating photoresist or utilizing the matrix material of having photosensitivity by itself, and obtaining the required shape, namely obtaining the final PDL.

After the PDL is prepared, one or more layers of light-emitting materials may be formed in a space defined by the PDL in sequence. For instance, as illustrated in FIG. 1, an HIL 51, an HTL 52, an EML 53, an ETL 54 and an EIL 55 are formed in sequence, and subsequently a cathode 4 is formed on the PDL 3 and the EIL 55. It should be understood that no specific limitation will be given herein to the embodiment. For instance, a three-layer light-emitting structure comprising an HTL, an EML and an ETL may be formed in sequence, or only a single layer structure having one EML is formed.

In the method for manufacturing the OLED device provided by the embodiment of the present invention, the matrix material layer doped with the metal nanoparticles is formed on the substrate provided with the anode. When the OLED device is applied with a voltage, light incident into the PDL interacts with the metal nanoparticles therein to generate SP or LSP resonance. The resonance effect not only can improve the excitation intensity and efficiency of fluorescent molecules, the fluorescence quantum yield and the internal quantum efficiency but also, more importantly, can greatly increase the light scattering and absorption cross-section of the metal nanoparticle so that light which cannot be emitted to the outside originally can be scattered, and hence can improve the external quantum efficiency and the luminous efficiency of the OLED device. In addition, compared with optical microcavity effect, the resonance effect cannot change the luminescent spectrum of the OLED device and maximally maintains the original color of the device while improving the luminous efficiency simultaneously.

Figure 4:
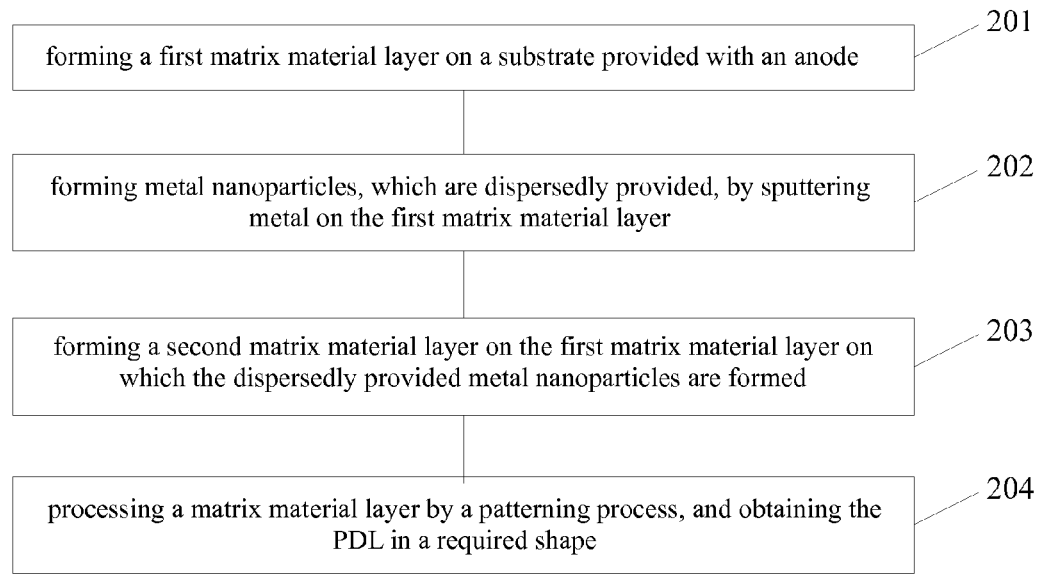
FIG. 4 is a flowchart of a method for manufacturing the OLED device, provided by another embodiment of the present invention.

In one embodiment of the present invention, as illustrated in FIG. 4, one example of the method for preparing the PDL comprises the following processes.

201: forming a first matrix material layer on a substrate provided with an anode.

In the step, the first matrix material layer may be formed by an electron-beam evaporation process or vapor deposition process. When the first matrix material layer is made of a material such as silicon dioxide, a silicon dioxide film layer is formed on the substrate by electron-beam evaporation or vapor deposition. Of course, the first matrix material layer may also be made of silicon oxynitride, aluminum oxide, etc. apart from silicon dioxide.

202: forming metal nanoparticles, which are dispersedly provided, by sputtering metal on the first matrix material layer.

In the step, one layer of metal nanoparticles, e.g., a silver nanoparticle layer, is coated by sputtering. It should be noted that the metal nanoparticles formed herein are discontinuous, as illustrated in FIG. 1. Optionally, the thickness of the metal nanoparticle layer may be from 1 to 3 nm.

203: forming a second matrix material layer on the first matrix material layer on which the dispersedly provided metal nanoparticles are formed.

The step is similar to the step 201. The second matrix material layer may also be formed by an electron-beam evaporation process or vapor deposition process. The second matrix material layer is made of materials such as silicon dioxide, silicon nitride oxide and aluminum oxide.

204: processing a matrix material layer formed by the first matrix material layer and the second matrix material layer by a patterning process, and obtaining the PDL in a required shape.

In the step, specific patterning process may be selected according to the matrix material adopted in the steps 201 and 203. For instance, when the first matrix material layer and the second matrix material layer are made of non-photosensitive SiO2, in the step, the PDL with the required shape may be obtained by the processing steps of exposure, development, etching and the like after the spin-coating of one layer of photoresist on the second matrix material layer.

Figure 5:
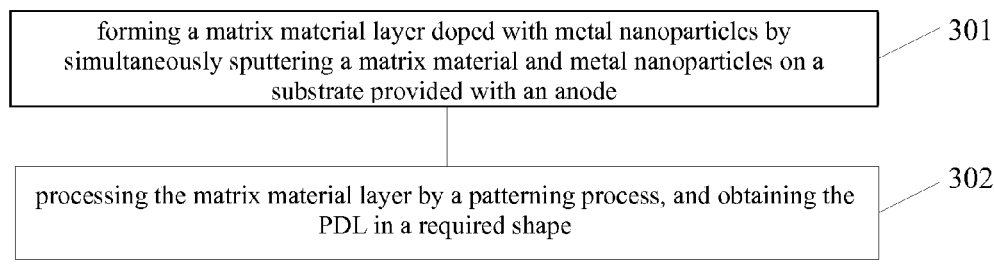
FIG. 5 is a flowchart of a method for manufacturing the OLED device, provided by still another embodiment of the present invention.

In another embodiment of the present invention, as illustrated in FIG. 5, another example of the method for preparing the PDL comprises the following processes.

301: forming a matrix material layer doped with metal nanoparticles by simultaneously sputtering a matrix material and metal nanoparticles on a substrate provided with an anode.

In the step, a composite film of the matrix material and the metal nanoparticles may be prepared by a multi-target magnetron sputtering technology. For instance, when the matrix material is silicon dioxide (SiO2) and the metal nanoparticle is gold (Au), the silicon dioxide and the gold are sputtered simultaneously to form an Au—SiO2 composite film. Composite films with different doping ratios may be obtained by the adjustment of the switching of a barrier plate in front of sputtering targets and the selection of the ratio of the metallic particles and the matrix materials deposited on the substrate. The matrix material may be silicon nitride oxide, aluminum oxide, etc. apart from silicon dioxide.

302: processing the matrix material layer by a patterning process, and obtaining the PDL in a required shape.

In the step, specific patterning process may be selected according to the matrix material adopted in the step 301. When the matrix material is non-photosensitive SiO2, in the step, the PDL in a required shape may be obtained by the processing steps of exposure, development, etching and the like after the spin-coating of one layer of photoresist on the matrix material layer.

The above two methods mainly adopt the sputtering technology to form the metal nanoparticles. In the sputtering process, the metal nanoparticles are likely to be exposed from a surface of the matrix material layer, which is not conducive to the performances of the OLED device. Therefore, after the steps 204 and 302 of the two methods, the process of removing exposed metal nanoparticles may also be included respectively.

For instance, the PDL in a required shape may be immersed into an etching solution to remove the exposed metal nanoparticles. Or an insulating layer may also be formed on the formed matrix material layer to prevent adverse effect of the metal nanoparticles exposed from the surface of the matrix material layer on the performances of the OLED device.

Figure 6:
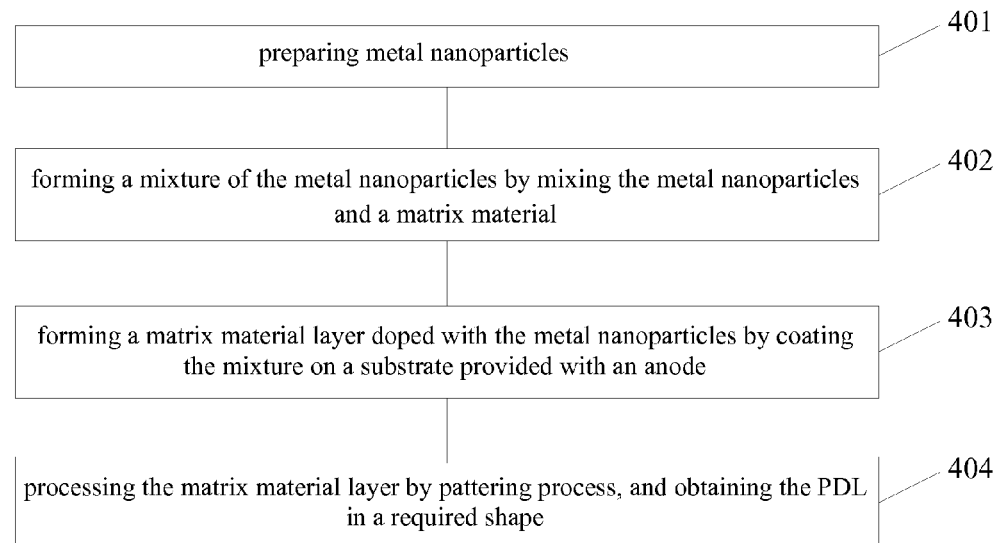
FIG. 6 is a flowchart of a method for manufacturing the OLED device, provided by still another embodiment of the present invention.

In still another embodiment of the present invention, as illustrated in FIG. 6, still another example of the method for preparing the PDL comprises the following processes.

401: preparing metal nanoparticles.

In the step, the metal nanoparticles may be prepared by thermal decomposition, electrochemical process, microwave reduction, chemical reduction and the like. Oil-soluble or water-soluble metal nanoparticles may be obtained by different preparation methods. Of course, the metal nanoparticles may be obtained from someone else.

402: forming a mixture of the metal nanoparticles by mixing the metal nanoparticles and a matrix material.

The matrix material in the step may be selected according to the fact that the formed metal nanoparticles are oil-soluble or water-soluble. For instance, when oil-soluble metal nanoparticles are obtained in the step 401, oil-soluble photoresist, e.g., polyimide material, generally used for forming the PDL may be selected as the matrix material in the step. When water-soluble metal nanoparticles are obtained in the step 401, water-soluble material, e.g., SiO2 gel, generally used for forming the PDL may be selected as the matrix material in the step.

403: forming a matrix material layer doped with the metal nanoparticles by coating the mixture on a substrate provided with an anode.

404: processing the matrix material layer by patterning process, and obtaining the PDL in a required shape.

In the step, the specific patterning process may be selected according to the matrix material selected in the step 402. When the matrix material is non-photosensitive SiO2, in the step, the PDL in a required shape may be obtained by the processing steps of exposure, development, etching and the like after the spin-coating of one layer of photoresist on the matrix material layer. When the matrix material is a photosensitive photoresist, e.g., polyimide material, the PDL in a required shape may be directly obtained by the processing steps of exposure, development and the like.

In one example, in order to reduce the fluorescent quenching phenomenon due to too close distance between the metal nanoparticles and the light-emitting molecules, after the step 402, the method may further comprise: forming an isolation layer in the periphery of the metal nanoparticles, and combining the isolation layer and the metal nanoparticles into an independent core-shell structure.

In the step, the material of the isolation layer may refer to the description of the foregoing embodiments. No further description will be given here. The metal nanoparticles may form the core-shell structure with the isolation layer. The isolation layer is, for instance, made of TiO2, polystyrene or the like.

One example of the step 402 may be as follows: forming a mixture of metal nanoparticles by mixing a matrix material and metal nanoparticles provided with an isolation layer in the periphery.

Detailed description will be given below to the preferred embodiments for better description of the OLED device and the manufacturing method thereof provided by the embodiment of the present invention.

Embodiment 1

OLED Device Comprising Ag—SiO2 PDL

As illustrated in FIG. 1, one layer of SiO2 film 31 is deposited on a substrate provided with an anode 2 (e.g., indium tin oxide (ITO)) by electron-beam evaporation or vapor deposition.

One silver layer with the thickness of 2 nm is coated on a surface of the SiO2 film 31 by means of sputtering. In the process of sputtering, the atmospheric pressure in a cavity is 10 Pa; the atmosphere is argon gas; the gas flow is maintained at 30 sccm (standard-state cubic centimeter per minute); the sputtering current is 0.2 A; the voltage is 0.5 KV; and the substrate temperature is 200 centigrade. Subsequently, the obtained product is placed in the vacuum environment with a vacuum degree of less than $1 \times 10^{-3}$ Pa and subjected to annealing for half an hour at the temperature of 300 centigrade, and hence cooled to the room temperature to form a discontinuous silver nanoparticle layer 32.

One layer of SiO2 film 33 is deposited on the discontinuous silver nanoparticle layer 32 by electron-beam evaporation or vapor deposition so as to cover silver particles.

The PDL 3 with required shape is obtained by exposure, development and etching after the spin-coating of one layer of photoresist.

The PDL in a required shape is immersed into a nitric acid etching solution for 1 minute to remove exposed silver in the periphery. Subsequently, the obtained product is cleaned and subjected to annealing again to obtain a PDL structure embedded with discontinuous silver particles.

An HIL 51, an HTL 52, an EML 53, an ETL 54, an EIL 55, a cathode layer 4 and the like are deposited in sequence in the space defined by the PDL 3 to finally form the OLED device as shown in FIG. 1.

Embodiment 2

OLED Device Comprising Au—SiO2 PDL

As illustrated in FIG. 2, the embodiment adopts a multi-target magnetron sputtering technology to prepare an Au—SiO2 composite film formed by metal nanoparticles and dispersed oxide.

In a multi-target magnetron sputtering cavity, one target is used for placing high-purity SiO2 and the other target is used for placing high-purity Au. The sputtering gas is high-purity argon (99.995%); the vacuum degree of the cavity before sputtering is $<5 \times 10^{-5}$ Pa; and the sputtering pressure is $1.6 \times 10^{-1}$ Pa. In the process of sputtering, the flow rate of argon and oxygen is respectively $8.3 \times 10^{-8}$ m3/s and $5.8 \times 10^{-8}$ m3/s; and the radio-frequency power of SiO2 and Au is respectively 200 W and 50 W. The ratio of the materials deposited on the substrate is selected by the adjustment of the switching of a barrier plate in front of sputtering targets, and finally the Au—SiO2 composite film with different doping ratio is obtained.

The Au—SiO2 composite film is processed by a patterning process, and the PDL 3 in a required shape is obtained. The patterning process may comprise a dry etching process such as plasma etching and may also comprise a wet etching process in which a photoresist is subjected to spin-coating at first and hence the obtained product is subjected to exposure and development. No further description will be given here.

The PDL is immersed into a KI/I2/H2O (1 g/1 g/200 mL) Au etching solution for 1 minute to remove exposed Au in the periphery, and a final PDL structure is obtained.

Subsequently, an HIL 51, an HTL 52, an EML 53, an ETL 54, an EIL 55, a cathode layer 4 and the like are deposited in sequence in a space defined by the PDL, and the OLED device is finally formed. The structure of the device is as shown in FIG. 2.

Embodiment 3

OLED Device Comprising Ag Nanocube-Polyimide PDL

A. Preparation of Ag Nanocubes

The present embodiment adopts a chemical reduction process to prepare the Ag nanocubes: injecting 3 mL (0.1M) ethylene glycol solution of silver nitrate and 3 mL (0.6M) ethylene glycol solution of polyvinylpyrrolidone (PVP) into a flask with three necks containing 5 mL ethylene glycol via a dual-channel injection pump, in which the ethylene glycol solutions are subjected to heating and thermostatic reflux at the temperature of 160 centigrade in advance; controlling the feed rate to be 0.3 mL/min; allowing a mixture to be subjected to reflux reaction for 60 min at the temperature of 160 centigrade under the condition of magnetic stirring; adding 5 to 10 times acetone more than the mixture for dilution after the completion of the reaction; repeating the centrifugation process and removing supernatant each time; and finally obtaining pure Ag nanocubes. The prepared Ag nanocubes are dispersed with isopropanol to obtain a solution capable of being subjected to spin-coating.

B. Preparation of PDL Containing Ag Nanocubes

The isopropanol solution of the dispersed Ag nanocubes is fully mixed with a photoresist materials applicable to form the PDL 3; one film layer of the composite material is formed, by spin-coating, on a substrate 1 provided with a conductive anode 2 (e.g., an ITO layer); and a patterned PDL structure 3 embedded with the Ag nanocubes is obtained by the processes of exposure, development and the like after drying.

C. Preparation of OLED Device

An HIL 51, an HTL 52, an EML 53, an ETL 54, an EIL 55, a cathode layer 4 and the like are deposited in sequence in the space defined by the PDL, and the OLED device is finally formed. The structure of the device is as shown in FIG. 2.

Embodiment 4

OLED Device Comprising Au-Polyimide PDL

A. Synthesizing of Au Nanoparticles

The Au nanoparticles synthesized in step A are oil-soluble. A photoresist materials compatible with the oil-soluble particles are selected in step B.

The size of the formed Au nanoparticles is controlled herein by a reverse microemulsion system. Description will be given below by taking surfactant 4-dodecyloxy benzylamine (C12OBA) having the protective function as an example.

The particular operation steps are as follows: firstly, 0.50 mL 9.7×10-3M chloroauric acid (HAuCl4) aqueous solution is placed into a 50 mL beaker and evaporated to dryness; 16.0 mL n-heptane, 4.0 mL n-butanol and 0.141 g 4-dodecyl benzylamine (the C12OBA/HAuCl4 molar ratio is 100:1) are added in sequence; and the mixture is subjected to ultrasonic dispersion at the room temperature to obtain a clear, transparent, and pale yellow solution. Secondly, 50 µL formic acid is added into the solution and subjected to ultrasonic dispersion for 2 minutes in such a way that the formic acid solubilizer can be dispersed in a microemulsion; the beaker is placed in the center of a tray of a modified microwave oven provided with a stirring apparatus and subjected to microwave radiation for about 25 s at the maximum heating power, and the solution is instantly converted into claret-red; the heating process is stopped immediately; and the stirring process is continued for 2 minutes and gold colloid stabilized with C12OBA is prepared. Thirdly, an appropriate amount of anhydrous ethanol is added into the gold colloid that has been cooled to the room temperature; Au nanoparticles coated by C12OBA may be precipitated from the system; and samples after washing in the anhydrous ethanol and being dried can be better dissolved in a chloroform solution.

Hydrophobic Au nanoparticles which have different sizes and shapes and protected by C12OBA can be prepared by the adjustment of the ratio of various compositions in the microemulsion.

B. Preparation of PDL

The Au nanoparticles prepared in step A are dissolved in the chloroform solution to form an Au chloroform solution; a certain amount of polyimide solution is added to form full mixture; the mixture is subjected to spin-coating; and the finally patterned PDL structure is obtained after a series of commonly used patterning processes in the semiconductor industry such as drying, exposure and development.

C. Manufacturing of OLED Device

One or more layers of light-emitting materials and a metal cathode layer are deposited in the PDL; and the OLED device having a PDL with uniformly distributed Au nanoparticles is obtained by encapsulation.

Embodiment 5

OLED Device Comprising Au@TiO2-SiO2 Gel PDL

A. Formation of Nanoparticles with Au@TiO2 in a Core-Shell Structure

Firstly, chloroauric acid (HAuCl4) is reduced with sodium citrate so that nano aurosol is prepared; secondly, an ethanol solution of tetrabutyl titanate is added; and thirdly, the nanoparticles with the Au@TiO2 in a core-shell structure are prepared after continuous stirring, reflux, filtration, washing and drying. The composite nanoparticles can be effectively dispersed in a hydrophilic solvent and used in the next process of forming the PDL.

B. Preparation of PDL by Sol-Gel Process

Firstly, the Au@TiO2 core-shell nanoparticles are ultrasonically dispersed in a water-ethanol system; secondly, ethyl orthosilicate, absolute ethyl alcohol and dilute hydrochloric acid are uniformly mixed according to a scale, and SiO2 gel is formed at the room temperature; thirdly, a Au@TiO2 disperse system and the SiO2 gel are mixed according to a scale to obtain a coating solution, and a SiO2 film embedded with Au@TiO2 particles is prepared by spin-coating (coated on an ITO layer with TFT drive units at the bottom) and drying; and fourthly, a patterned PDL structure is obtained by the processes of exposure, development, fixation and the like after the spin-coating of one layer of photoresist.

C. Manufacturing of OLED Device

One or more layers of light-emitting materials and a metal cathode layer are deposited in the PDL; and the OLED device having the PDL with uniformly distributed Au nanoparticles is obtained by encapsulation.

Embodiment 6

OLED Device Comprising Ag@Polystyrene-Polyimide PDL

A. Synthesizing of Ag@Polystyrene in a Core-Shell Structure 1.0 g nano-Ag powders and 1.0 g PVP are added into 80 mL water and the resultant mixture is subjected to continuous ultrasonic dispersion for 0.5 h (power: 500 W) with an ultrasonic generator; then 1.0 g emulsifier is added, and the resultant mixture is subjected to continuous ultrasonic dispersion for 0.5 h (power: 500 W) with the ultrasonic generator to obtain a uniform disperse system; the uniform disperse system is transferred into a flask with four necks provided therein with a motor stirrer, a serpentine condenser, and an N2 pipe; the above device is placed in a constant temperature water tank, stirred continuously for about 10 minutes, and cooled to 30 centigrade to avoid the premature decomposition of initiator KPS (potassium persulfate) after addition due to overhigh temperature; the initiator KPS is added and stirred continuously for 20 minutes, and N2 gas is introduced while 02 gas is discharged during the period; purified styrene monomers are placed in a drop funnel and added into a reaction system dropwise, and the process continues for about 10 min; the temperature is raised to 70 centigrade, and the stirring rate and the N2 introduction rate are maintained constantly in the reaction process; the reaction is completed after 5 h, and the temperature is reduced to be less than 40 centigrade under the stirring state for discharge, and hence compounded latex is obtained; and after a certain amount of compounded latex is subjected to a demulsification process with NaCl, the Ag@Polystyrene in a core-shell structure taking Ag nanoparticles as the core and the polystyrene as the shell is obtained after filtration, washing and drying.

B. Preparation of PDL

The above prepared Ag@Polystyrene in a core-shell structure is dispersed in an organic solvent and mixed with a polyimide solution; a photoresist film is formed by spin-coating process; and a patterned PDL structure is obtained by the processes of drying, exposure, development, fixation and the like in sequence. The PDL structure contains uniformly distributed Ag@Polystyrene core-shell nanoparticles.

C. Manufacturing of OLED Device

One or more layers of light-emitting materials and a metal cathode layer are deposited in the PDL; and the OLED device having PDL with uniformly distributed Au nanoparticles is obtained by encapsulation.

The foregoing is only the preferred embodiments of the present invention and not intended to limit the scope of protection of the present invention. The scope of protection of the present invention should be defined by the appended claims.

The invention claimed is:

1. An organic light-emitting diode (OLED) device, comprising a pixel define layer (PDL) and a light-emitting structure, wherein the PDL contains metal nanoparticles therein, wherein the nanoparticles are distributed only in a plane around the middle of the PDL, wherein an isolation layer is disposed between the metal nanoparticles and light-emitting molecules in the light-emitting structure, and wherein the isolation layer is not part of the PDL and the isolation layer and the metal nanoparticles are combined in independent core-shell structure, wherein the PDL does not cover the entire horizontal plane of the light-emitting structure.

2. The OLED device according to claim 1, wherein the isolation layer is made of an insulating material.

3. The OLED device according to claim 1, wherein metallic material in the metal nanoparticles comprises:
   one selected from gold, silver and aluminum; or
   one selected from alloy of gold, alloy of silver and alloy of aluminum; or
   an alloy formed of any two or three of gold, silver and aluminum.

4. The OLED device according to claim 1, wherein a shape of the metal nanoparticles is one or more selected from sphere, prism, cube and cage.

5. The OLED device according to claim 1, wherein a particle diameter of the metal nanoparticles is from 1 to 100 nm.

6. An organic light-emitting diode (OLED) device, comprising:
   a substrate;
   a pixel define layer (PDL) attached to a first portion of the surface area of a first face of the substrate, wherein the PDL contains metal nanoparticles therein, wherein the nanoparticles are distributed only in a plane around the middle of the PDL;
   an anode and a light emitting structure having light-emitting molecules embossed within the PDL, wherein the anode is also attached to a second portion of the surface area of the first face of the substrate; and
   an insulating isolation layer distinct from the PDL and disposed between the metal nanoparticles and light emitting molecules of the light emitting structure.

* * * * *